United States Patent [19]

Fox

[11] 4,439,694
[45] Mar. 27, 1984

[54] COMPARATOR CIRCUIT

[75] Inventor: Jeffrey R. Fox, Concord, Mass.

[73] Assignee: GTE Laboratories Incorporated, Waltham, Mass.

[21] Appl. No.: 332,387

[22] Filed: Dec. 21, 1981

[51] Int. Cl.³ .................... H03K 5/153; H03K 3/356
[52] U.S. Cl. .................................. 307/362; 307/279; 307/530
[58] Field of Search ................ 307/350, 362, 530, 279

[56] References Cited

U.S. PATENT DOCUMENTS 4,096,402  6/1978  Schroeder et al. ................ 307/362

Primary Examiner—John Zazworsky
Attorney, Agent, or Firm—David M. Keay

[57] ABSTRACT

A metal-oxide-silicon (MOS) field effect transistor (FET) regenerative differential comparator circuit particularly suited for use in sigma-delta modulation apparatus. The circuit includes two differential amplifier stages followed by a latching amplifier stage. A regenerative latching section of two cross-connected latching FET's is connected to the latching amplifier stage. Each of the latching FET's is connected in series with a separate switching FET. A strobe pulse turns on the two switching FET's enabling the latching FET's. Depending on the relative polarity of the differential voltage produced by the latching amplifier stage, regenerative action drives one of the two latching FET's into heavy conduction thereby producing an appropriate digital output. The first two differential amplifier stages remain enabled during the regenerative action permitting high speed operation.

7 Claims, 1 Drawing Figure

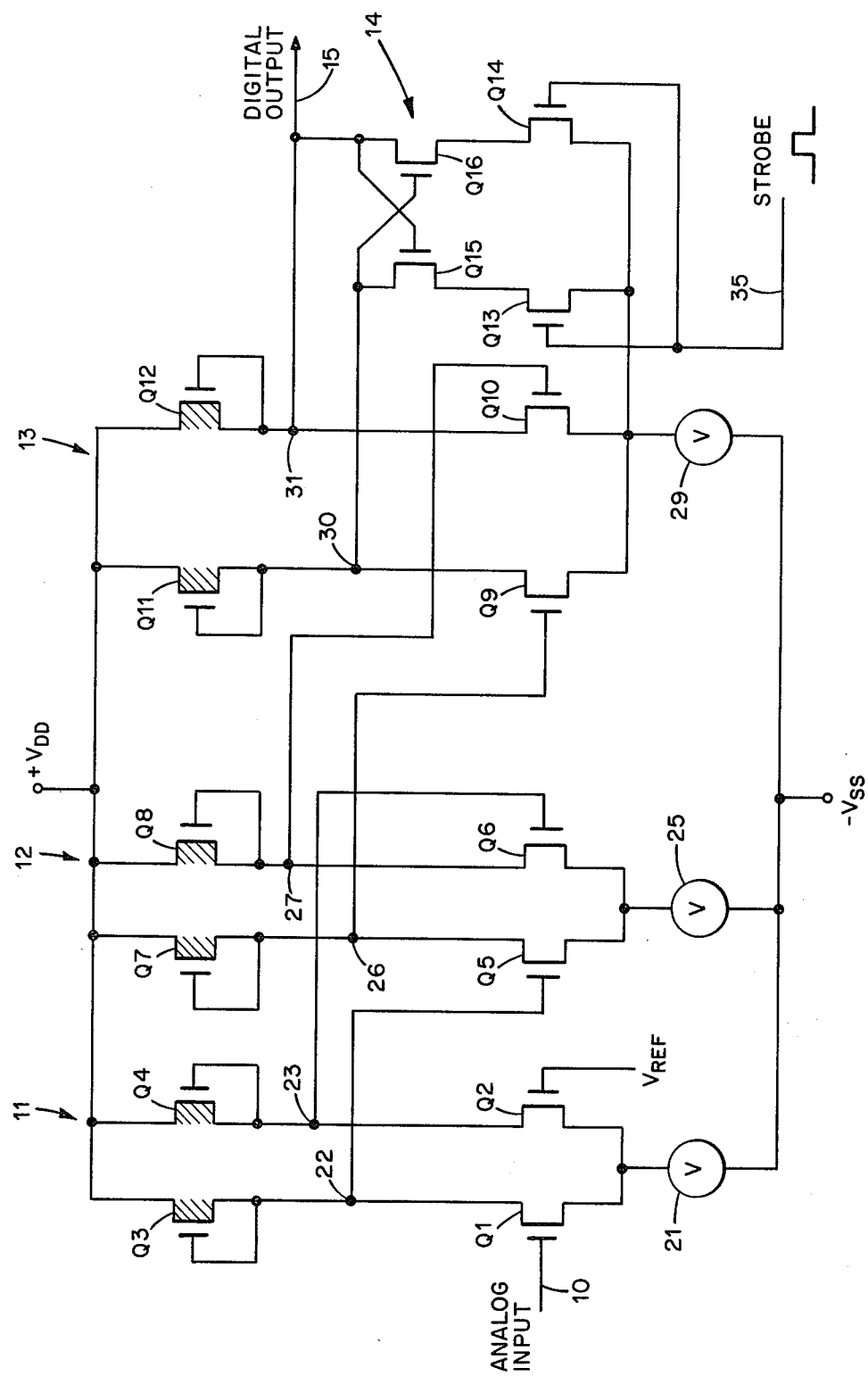

COMPARATOR CIRCUIT

BACKGROUND OF THE INVENTION

This invention relates to comparator circuits. More particularly, it is concerned with comparator circuits employing metal-oxide-silicon (MOS) field effect transistors (FET).

One type of comparator circuit which has been developed recently employs MOS FET's in a regenerative differential comparator circuit. The circuit utilizes differential amplifier stages and includes a regenerative latching section which latches an amplified version of an analog input voltage. An improved version of such a comparator circuit is disclosed and claimed in application Ser. No. 249,036 filed Mar. 30, 1981 by Michael Cooperman and William L. Geller entitled "Comparator Circuit" and assigned to the assignee of the present application. For certain applications, specifically in digital-to-analog and analog-to-digital converters employed in sigma-delta modulation apparatus, it is desirable to provide a comparator circuit having further improved speed and sensitivity.

SUMMARY OF THE INVENTION

Improved speed and sensitivity characteristics are obtained with comparator circuits in accordance with the present invention. Such a comparator circuit comprises an input differential amplifier means including first and second field effect transistors with the input of the first field effect transistor connected to a signal input terminal and the input of the second field effect transistor connected to a point of reference potential. The input differential amplifier means has first and second output connections on which differential output signals are produced. The comparator circuit also comprises a latching differential amplifier means including first and second field effect transistors with their inputs coupled to the first and second output connections, respectively, of the input differential amplifier means. The latching differential amplifier means has first and second output connections on which are produced differential output signals. A regenerative latch means includes first and second latching field effect transistors. The input of the first latching field effect transistor is connected to the second latching field effect transistor and to the second output connection of the latching differential amplifier means. The input of the second latching field effect transistor is connected to the first latching field effect transistor and to the first output connection of the latching differential amplifier means.

An output terminal is connected to one of the latching field effect transistors. The first and second latching field effect transistors, when enabled, operate in a first set of operating conditions and produce a first output signal at the output terminal in response to differential output signals of one relative polarity at the output connections of the latching differential amplifier means. The first and second latching field effect transistors, when enabled, operate in a second set of operating conditions and produce a second output signal at the output terminal in response to differential output signals of the opposite relative polarity at the output connections of the latching differential amplifier means. The regenerative latch means also includes first and second switching field effect transistors connected to the first and second latching field effect transistors, respectively. The switching field effect transistors respond to a strobe signal to enable the first and second latching field effect transistors. Thus, in response to a strobe signal the switching field effect transistors enable the latching field effect transistors. The latching field effect transistors are switched by regenerative action to either the first or the second set of operating conditions, producing either a first or a second output signal at the output terminal, as determined by the relative polarity of the output signals at the output connections of the latching differential amplifier means.

BRIEF DESCRIPTION OF THE DRAWING

The single FIGURE of the drawing is a schematic circuit diagram of a comparator circuit in accordance with the present invention.

For a better understanding of the present invention, together with other and further objects, advantages, and capabilities thereof, reference is made to the following discussion and appended claims in connection with the above-described drawing.

DETAILED DESCRIPTION OF THE INVENTION

The single FIGURE of the drawing illustrates a metal-oxide-silicon (MOS) field effect transistor (FET) comparator circuit in accordance with the present invention. In the circuit illustrated all of the FET's are N-channel enhancement and depletion type devices. As is well understood, the FET devices of the circuit and their interconnections as illustrated may be fabricated as an integrated circuit in a single body of semiconductor material.

The comparator circuit as illustrated in the FIGURE includes an input differential amplifier 11, an intermediate differential amplifier 12, a latching differential amplifier 13, and a regenerative latch section 14. Analog input signals are applied at an input connection 10 and digital output signals are taken at an output terminal 15.

The input differential amplifier 11 includes two enhancement type FET's Q1 and Q2 each having one of its conductive path electrodes (source) connected to that of the other and through a constant current source 21 to a negative voltage source $-V_{SS}$, which is also connected to the substrate. The analog input connection 10 is connected to the gate of FET Q1, and the gate of FET Q2 is connected to a point of reference potential $V_{REF}$. The other conductive path electrode (drain) of FET Q1 is connected to a resistive load which is provided by a depletion type FET Q3 having its gate connected directly to its source and its drain connected to a positive voltage source $+V_{DD}$. The drain of FET Q2 is similarly connected through a resistive load of a depletion type FET Q4 having its gate connected to its source and its drain connected to the positive voltage source $+V_{DD}$. First and second output connections 22 and 23 are taken at the junctures of FET's Q1 and Q2 with FET's Q3 and Q4, respectively.

The intermediate differential amplifier 12 is similar to the input differential amplifier 11 and includes two enhancement type FET's Q5 and Q6 having their gates connected to the first and second output connections 22 and 23, respectively, of the input differential amplifier 11. The sources of FET's Q5 and Q6 are connected together and through a constant current source 25 to the negative voltage source $-V_{SS}$. Their drains are connected through resistive loads of depletion type FET's Q7 and Q8, respectively, to the positive voltage source $+V_{DD}$. First and second output connections 26 and 27 are taken at the junctures of FET's Q5 and Q6 with FET's Q7 and Q8, respectively.

The latching differential amplifier 13 includes two enhancement type FET's Q9 and Q10 having their gates connected to the output connections 26 and 27, respectively, of the intermediate differential amplifier 12. The sources of FET's Q9 and Q10 are connected together and through a constant current source 29 to the negative voltage source $-V_{SS}$. The drains of FET's Q9 and Q10 are connected through resistive loads formed by depletion type FET's Q11 and Q12, respectively, to the positive voltage source $+V_{DD}$.

The regenerative latch section 14 includes two enhancement type latching FET's Q15 and Q16. The gates and drains of FET's Q15 and Q16 are cross-connected. The gate of FET Q16 is also connected to the output connection 30 at the juncture of FET's Q9 and Q11 of the latching differential amplifier. The gate of FET Q15 is also connected to the output connection 31 at the juncture of FET's Q10 and Q12 of the latching differential amplifier. The digital output terminal 15 is connected to output connection 31. The source of FET Q15 is connected to the drain of an enhancement type switching FET Q13. The source of FET Q13 is connected to the constant current source 29. Similarly, an enhancement type switching FET Q14 has its drain connected to the source of FET Q16 and its source connected to the constant current source 29. The gates of switching FET's Q13 and Q14 are connected together to a strobe connection 35 to which are applied positive strobe pulses as will be explained hereinbelow.

The differential amplifier stages 11, 12, and 13 operate as is well understood to produce differential output signals at their output connections. Thus the difference between the voltage at the analog input connection 10 and the reference voltage $V_{REF}$ is amplified through the differential gain stages to produce an amplified differential signal at the output connections 30 and 31 of the latching differential amplifier 13. While the signal at the strobe input 35 is low, both switching FET's Q13 and Q14 are biased in the off condition providing a high impedance in the current path of latching FET's Q15 and Q16 and disabling both latching FET's.

In response to a positive strobe pulse at the strobe input 35, both switching FET's Q13 and Q14 are turned on presenting a low impedance to current flow through latching FET's Q15 and Q16 thus enabling both latching FET's. The differential signals between the output connections 30 and 31 of the latching differential amplifier 13 applied to the cross-connected latching FET's Q15 and Q16 cause regenerative switching of the latching FET's. Depending on the relative polarity of the differential signals at the output connections 30 and 31, one of the latching FET's Q15 and Q16 is triggered into heavy conduction and the other is effectively turned off. The FET's Q11 and Q12 of the latching differential amplifier 13 become the resistive loads of the latching FET's Q15 and Q16. Since one of the latching FET's Q15 and Q16 is operating in heavy conduction and the other is off, a predetermined high voltage is produced at one of the connections 30,31 and a predetermined low voltage is produced at the other. The voltage level present at connection 31 is the digital output signal at the digital output terminal 15.

One specific embodiment of a comparator circuit as described for use in sigma-delta modulation apparatus employed a positive voltage source $+V_{DD}$ of $+5$ volts, a negative voltage source $-V_{SS}$ of $-5$ volts, and a reference voltage $V_{REF}$ of $+2.5$ volts. The input differential amplifier stage 11 produced a gain of 21 and the intermediate differential amplifier produced a gain of 10. The latching differential amplifier 13 produced unity gain in the non-regenerative operating mode. The output voltage at the digital output terminal 15 during a strobe pulse was either 0 volts representing a logic "0" or $+5$ volts representing a logic "1". The strobe signal was a square-wave at a frequency of 2.048 MHz.

The frequency response of an MOS FET circuit is strongly related to the parasitic capacitances associated with the FET's. The major parasitic capacitances are gate-to-source, gate-to-drain, gate-to-bulk (the bulk semiconductor material), source-to-bulk, and drain-to-bulk. When the FET is off, the gate-to-bulk capacitance dominates. In saturation the gate-to-source capacitance dominates, and in the linear region of operation both the gate-to-source and gate-to-drain capacitances dominate and are approximately equal. The drain-to-bulk and source-to-bulk capacitances are voltage dependent.

To obtain high speed operation in an MOS FET circuit the effects of the parasitic capacitances must be considered. In the comparator circuit as shown and described hereinabove, the first two differential amplifier stages 11 and 12 have the highest gain and also the slowest switching speed. It is desirable that these stages continuously remain responsive to minute changes in the analog input signal. In many prior art strobed regenerative differential comparator circuits, however, the input stages are disabled when the regenerative stage is latched in order to prevent a large differential analog input signal from overcoming the regenerative action and triggering the regenerative latching action prematurely. Disabling may be accomplished as by employing switching transistors which prevent current flow through the FET's of a differential pair during a strobe pulse. Disabling the input stages limits their ability to respond to minute changes in the analog input signal by upsetting the maximum gain bias point and introducing a switching transient in every operating cycle. In the comparator circuit as shown and described the input stages remain active. There are no switching transistors connected in series with the FET's of a differential pair for disabling them during strobe pulses. In sigma-delta modulation the "error voltage" or sample-to-sample voltage change applied at the analog input connection is relatively small, for example 3.6 millivolts maximum. When amplified by 210, the cumulative gain of the first two differential amplifier stages, a maximum signal of 756 millivolts appears at the inputs to the latching stage. This voltage is not sufficient to overcome the regenerative latching action while the strobe pulse is present.

As described hereinabove, during regenerative latching one or the other of the latching FET's Q15 and Q16 is conducting heavily. None of the other FET's are in heavy conduction. In order to obtain high recovery speed the nonregenerative gain of the latching differential amplifier 13 is unity and a relatively high quiescent current is allowed to flow through the resistive load FET's Q11 and Q12. As a consequence FET's Q9 and Q10 can be made relatively small, presenting a low gate load capacitance to the preceding stage and a low drain-to-bulk capacitance to the output of stage 13.

Latching FET's Q15 and Q16 are enabled by the strobe pulse to the separate switching FET's Q13 and Q14. By employing separate switching FET's, both of the cross-coupled latching FET's Q15 and Q16 are biased off at the instant the strobe pulse is applied and thus the gate-to-bulk parasitic capacitance is dominant. Therefore when the regenerative action starts, capacitive coupling from the strobe input to the connection 30 and to the connection 31 are small and equal facilitating proper regeneration response when the differential voltage at connections 30 and 31 is relatively small.

While there has been shown and described what is considered a preferred embodiment of the present invention, it will be obvious to those skilled in the art that various changes and modifications may be made therein without departing from the invention as defined by the appended claims.

What is claimed is:

1. A comparator circuit comprising
   input differential amplifier means including
      first and second field effect transistors,
      the input of the first field effect transistor being connected to a signal input terminal and the input of the second field effect transistor being connected to a point of reference potential, and
      first and second output connections for producing differential output signals thereon;
   latching differential amplifier means including
      first and second field effect transistors,
      the inputs of the first and second field effect transistors being coupled to the first and second output connections, respectively, of the input differential amplifier means, and
      first and second output connections for producing differential output signals thereon; and
   regenerative latch means including
      first and second latching field effect transistors,
      the input of the first latching field effect transistor being connected to the second latching field effect transistor and to the second output connection of the latching differential amplifier means,
      the input of the second latching field effect transistor being connected to the first latching field effect transistor and to the first output connection of the latching differential amplifier means,
      an output terminal connected to one of said latching field effect transistors,
      said first and second latching field effect transistors when enabled being operable in a first set of operating conditions and producing a first output signal at the output terminal in response to differential output signals of one relative polarity at the output connections of the latching differential amplifier means, and being operable in a second set of operating conditions and producing a second output signal at the output terminal in response to differential output signals of the opposite polarity at the output connections of the latching differential amplifier means, and
      first and second switching field effect transistors connected to said first and second latching field effect transistors, respectively, and operable in response to a strobe signal applied thereto to enable the first and second latching field effect transistors
   whereby in response to a strobe signal said switching field effect transistors enable said latching field effect transistors causing said latching field effect transistors to be switched by regenerative action to said first or second set of operating conditions producing said first or second output signal at the output terminal as determined by the relative polarity of the output signals at the output connections of the latching differential amplifier means.

2. A comparator circuit in accordance with claim 1 including
   current source means;
   said first and second switching field effect transistors being connected in series between said first and second latching field effect transistors, respectively, and said current source means;
   said first and second switching field effect transistors providing a high impedance between said first and second latching field effect transistors, respectively, and said current source means in the absence of a strobe signal thereto preventing the flow of current through said latching field effect transistors; and
   said first and second switching field effect transistors providing a low impedance between said first and second latching field effect transistors, respectively, and said current source means during a strobe signal thereto permitting the flow of current through said latching field effect transistors.

3. A comparator circuit in accordance with claim 2 wherein
   the first and second field effect transistors of the latching differential amplifier means are connected in series between first and second resistive loads, respectively, and the current source means;
   the gate electrode of the first field effect transistor of the latching differential amplifier means is coupled to the first output connection of the input differential amplifier means, and the gate electrode of the second field effect transistor of the latching differential amplifier means is coupled to the second output connection of the input differential amplifier means;
   said first and second output connections of the latching differential amplifier means are connected to the junctures of the first and second field effect transistors and the first and second resistive loads, respectively;
   said first latching field effect transistor and said first switching field effect transistor are connected in series between the first output connection of the latching differential amplifier means and the current source means, and said second latching field effect transistor and said second switching field effect transistor are connected in series between the second output connection of the latching differential amplifier means and the current source means;
   the gate electrode of said first latching field effect transistor is connected to the second output connection of the latching differential amplifier means, and the gate electrode of said second latching field effect transistor is connected to the first output connection of the latching differential amplifier means; and
   the gate electrodes of the first and second switching field effect transistors are connected together for receiving strobe signals thereon.

4. A comparator circuit in accordance with claim 3 wherein
   the first resistive load of the latching differential amplifier means is connected between a source of operating potential and one of the conductive path electrodes of the first field effect transistor of the latching differential amplifier means;

the other conductive path electrode of the first field effect transistor of the latching differential amplifier means is connected directly to the current source means;

the second resistive load of the latching differential amplifier means is connected between said source of operating potential and one of the conductive path electrodes of the second field effect transistor of the latching differential amplifier means;

the other conductive path electrode of the second field effect transistor of the latching differential amplifier means is connected directly to the current source means;

whereby the first and second field effect transistors of the latching differential amplifier means remains responsive to changes in the differential output signal from the input differential amplifier means applied thereto while the latching field effect transistors of the regenerative latch means are enabled and operating in the first or the second set of operating conditions.

5. A comparator circuit in accordance with claim 4 wherein
said first and second field effect transistors of said input differential amplifier means are connected in series between first and second resistive loads, respectively, and a current source means;
the gate electrode of said first field effect transistor is connected to said signal input terminal;
the gate electrode of said second field effect transistor is connected to said point of reference potential; and
said first and second output connections of the input differential amplifier means are connected to the junctures of the first and second field effect transistors and the first and second resistive loads, respectively.

6. A comparator circuit in accordance with claim 5 wherein
said first and second field effect transistors of said input differential amplifier means, said first and second field effect transistors of said latching differential amplifier means, said latching field effect transistors and said switching field effect transistors are each an enhancement type field effect transistor; and
said first and second resistive loads of said input differential amplifier means and said first and second resistive loads of said latching differential amplifier means are each a depletion type field effect transistor.

7. A comparator circuit in accordance with claim 6 including an intermediate differential amplifier means having
first and second field effect transistors connected in series between first and second resistive loads, respectively, and a current source means;
the gate electrode of the first field effect transistor being connected to the first ouput connection of the input differential amplifier means and the gate electrode of the second field effect transistor being connected to the second output connection of the input differential amplifier means;
the juncture of the first field effect transistor and the first resistive load being connected to the gate electrode of the first field effect transistor of the latching differential amplifier means, and the juncture of the second field effect transistor and the second resistive load being connected to the gate electrode of the second field effect transistor of the latching differential amplifier means;
said first and second field effect transistors each being an enhancement type field effect transistor; and
said first and second resistive loads each being a depletion type field effect transistor.

* * * * *